(12) United States Patent
Ohhashi et al.

(10) Patent No.: US 8,354,365 B2
(45) Date of Patent: Jan. 15, 2013

(54) CLEANING LIQUID FOR LITHOGRAPHY AND METHOD FOR FORMING WIRING

(75) Inventors: Takuya Ohhashi, Kawasaki (JP); Masaru Takahama, Kawasaki (JP); Takahiro Eto, Kawasaki (JP); Daijiro Mori, Kawasaki (JP); Shigeru Yokoi, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 13/016,868

(22) Filed: Jan. 28, 2011

(65) Prior Publication Data
US 2011/0195573 A1  Aug. 11, 2011

(30) Foreign Application Priority Data

Feb. 8, 2010  (JP) ................................ 2010-025817

(51) Int. Cl.
*C11D 7/06*  (2006.01)
*C11D 7/26*  (2006.01)
*C11D 7/32*  (2006.01)
*C11D 7/50*  (2006.01)

(52) U.S. Cl. ........ 510/176; 510/175; 510/245; 510/255; 510/259; 510/261; 510/264; 510/272; 510/500; 510/504; 510/505; 510/506; 134/1.2; 134/1.3

(58) Field of Classification Search .................. 510/175, 510/176, 245, 255, 259, 261, 264, 272, 500, 510/504, 505, 506; 134/1.2, 1.3
See application file for complete search history.

(56) References Cited

U.S. PATENT DOCUMENTS
2005/0287480 A1* 12/2005 Takashima .................... 430/331

FOREIGN PATENT DOCUMENTS
| | | |
|---|---|---|
| JP | 2002-357908 | 12/2002 |
| JP | 2004-103771 | 4/2004 |
| JP | 2006-527783 | 12/2006 |
| WO | WO2008/039730 * | 4/2008 |

* cited by examiner

*Primary Examiner* — Gregory Delcotto
(74) *Attorney, Agent, or Firm* — Knobbe Martens Olson & Bear LLP

(57) ABSTRACT

Provided are a cleaning liquid for lithography that exhibits excellent corrosion suppression performance in relation to ILD materials, and excellent removal performance in relation to a resist film and a bottom antireflective coating film, and a method for forming a wiring using the cleaning liquid for lithography. The cleaning liquid for lithography according to the present invention includes a quaternary ammonium hydroxide, a water soluble organic solvent, water, and an inorganic base. The water soluble organic solvent contains a highly polar solvent having a dipole moment of no less than 3.0 D, a glycol ether solvent and a polyhydric alcohol, and the total content of the highly polar solvent and the glycol ether solvent is no less than 30% by mass relative to the total mass of the liquid for lithography.

3 Claims, No Drawings

CLEANING LIQUID FOR LITHOGRAPHY AND METHOD FOR FORMING WIRING

This application is based on and claims the benefit of priority from Japanese Patent Application No. 2010-025817, filed on 8 Feb. 2010, the content of which is incorporated herein by reference.

BACKGROUND OF THE INVENTION

1. Field of the Invention

The present invention relates to a cleaning liquid for lithography. More particularly, the present invention relates to a cleaning liquid for lithography that enables efficient removal of a resist film and a bottom antireflective coating film, without causing corrosion to corrosion-prone materials such as a low dielectric constant material, or the like. Furthermore the present invention relates to a method for forming a wiring using the cleaning liquid for lithography.

2. Related Art

A semiconductor device is a laminate of a metallic wiring layer, a low dielectric constant layer, an insulation layer, or the like on a substrate such as a silicon wafer, and the like. This type of semiconductor device is manufactured by processing each layer using a lithography method that employs an etching process using a resist pattern as a mask.

The resist film or a temporary laminate film (also referred to as "a sacrificial film") used in the lithography method, and furthermore residue materials originating from a metallic wiring layer and/or a low dielectric constant layer produced during the etching process are removed using a cleaning liquid to prevent an adverse effect on the semiconductor device, and furthermore to prevent impediment to a subsequent processing step.

In recent years, methods for forming a wiring using a damascene method have been employed in response to advances in high-density and highly integrated semiconductor devices. Copper that is prone to undergo corrosion is used as a metallic wiring material that configures the metallic wiring layer of the semiconductor device in this type of wiring formation method. Furthermore, a low dielectric constant material (also referred to as "ILD (interlayer dielectric) material") is used to configure the low dielectric constant layer. Advances in achieving a low dielectric constant have resulted in use of such ILD materials that are prone to undergo corrosion. Consequently, there is a need for development of a cleaning liquid that does not cause corrosion of such corrosion-prone materials when washing the substrate.

In a method for forming a wiring using a damascene method, the material used as a sacrificial film during the etching process bears an extremely strong resemblance to the configuration of an ILD material. Consequently there is a need for development of a cleaning liquid that leaves one of these strongly similar materials (the ILD material) on the device without causing corrosion while enabling efficient removal of the other material (sacrificial film).

Furthermore, in a method for forming a conventional aluminum wiring, there has been no need for high cleaning performance in a cleaning liquid since a washing process using a chemical liquid is performed after an oxygen-plasma ashing process step. However this type of oxygen-plasma ashing process cannot be used during washing of a substrate that includes a corrosion-prone material such as an ILD material. Consequently, there is a need for development of a cleaning liquid that has robust cleaning performance enabling complete removal of various types of residue materials even in the absence of the above type of oxygen-plasma ashing process step.

A conventional cleaning liquid for lithography used in a manufacturing process of this type of semiconductor device has been proposed that contains a quaternary ammonium hydroxide, a water soluble organic solvent, water, and an anti-corrosion agent (for example, refer to Patent Documents 1 and 2). Such a cleaning liquid for lithography realizes a large improvement in relation to removal performance of various types of residue materials in comparison to previous cleaning liquids, and exhibits excellent corrosion suppression performance in relation to corrosion-prone materials.

A cleaning liquid for lithography has also been proposed in which 1% by mass or less of potassium hydroxide relative to the total mass is further added to a material containing a quaternary ammonium hydroxide, a water soluble organic solvent, water, and an anti-corrosion agent (refer to Patent Document 3). Such a cleaning liquid for lithography including potassium hydroxide as described above achieves a higher level of removal performance without causing corrosion of a corrosion-prone material such as an ILD material.

Patent Document 1: Japanese Unexamined Patent Application, First Publication No. 2002-357908

Patent Document 2: Japanese Unexamined Patent Application, First Publication No. 2004-103771

Patent Document 3: Japanese Translation of PCT International Publication, No. 2006-527783

SUMMARY OF THE INVENTION

Meanwhile, when, for example, a low dielectric constant layer is subjected to an etching process using a resist pattern as a mask, a bottom antireflective coating film (BARC) may be formed on the bottom layer of a resist film. In this case, it is necessary to remove the resist film and the bottom antireflective coating film using a cleaning liquid following the etching step so as not to inhibit the following steps. However, removal of the resist film deteriorated due to etching, and the bottom antireflective coating film having a high crosslinking density is difficult. On the other hand, ILD materials that configure the low dielectric constant layer are prone to undergo corrosion. Accordingly, it has been difficult to efficiently remove the resist film and the bottom antireflective coating film with such a cleaning liquid for lithography disclosed in the above-mentioned Patent Documents while suppressing corrosion of the ILD material.

The present invention has been proposed in light of the above situation, and has the object of providing a cleaning liquid for lithography that exhibits excellent corrosion suppression performance in relation to an ILD material, and also excellent removal performance in relation to a resist film and a bottom antireflective coating film. In addition, another object of the present invention is to provide a method for forming a wiring using the cleaning liquid for lithography.

The present inventors performed diligent research to solve the above problems. As a result, the present invention was completed with the insight that the above problems could be solved by preparing a water soluble organic solvent included in the cleaning liquid for lithography so as to have a specific composition. More specifically, the present invention is configured as described below.

A first aspect of the present invention is a cleaning liquid for lithography including a quaternary ammonium hydroxide, a water-soluble organic solvent, water, and an inorganic base, in which the water soluble organic solvent contains a highly polar solvent having a dipole moment of no less than 3.0 D, a glycol ether solvent and a polyhydric alcohol, and in which the total content of the highly polar solvent and the glycol ether solvent is no less than 30% by mass relative to the total mass of the cleaning liquid for lithography.

A second aspect of the present invention is a method for forming a wiring which forms a metallic wiring layer by embedding a metal into an etching space that is formed in a dielectric layer of a semiconductor multilayer laminate using a resist film, the method including after formation of the etching space, removing at least the resist film using the cleaning liquid for lithography according to the present invention.

According to the present invention, a cleaning liquid for lithography can be provided that exhibits excellent corrosion suppression performance in relation to an ILD material, and that exhibits excellent removal performance for a resist film and a bottom antireflective coating film. Furthermore, a method for forming a wiring using the cleaning liquid for lithography is provided.

DETAILED DESCRIPTION OF THE INVENTION

Cleaning Liquid for Lithography

The cleaning liquid for lithography according to the present invention includes a quaternary ammonium hydroxide, a water soluble organic solvent, water, and an inorganic base. Although the invention will be described in detail hereafter, in the absence of a particular limitation, each material may be a commercially available substance.

Quaternary Ammonium Hydroxide

The quaternary ammonium hydroxide is preferably a compound represented by the following general formula (1).

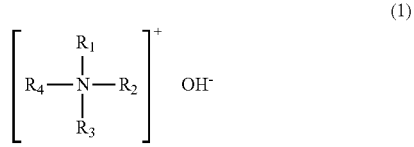

In the above general formula (1), $R_1$ to $R_4$ each independently represent an alkyl group or a hydroxyalkyl group having 1 to 4 carbon atoms.

Among the compounds represented by the above general formula (1), at least one selected from the group consisting of tetramethyl ammonium hydroxide, tetraethyl ammonium hydroxide, tetrapropyl ammonium hydroxide, tetrabutyl ammonium hydroxide, methyltripropyl ammonium hydroxide, methyltributyl ammonium hydroxide, and (2-hydroxyethyl)trimethyl ammonium hydroxide are particularly preferred due to being freely available. Furthermore tetramethyl ammonium hydroxide and/or tetraethyl ammonium hydroxide are preferred in light of high dissolution properties in relation to a sacrificial film.

The content of the quaternary ammonium hydroxide is preferably 5 to 15% by mass, and more preferably 5 to 10% by mass relative to the total mass of the cleaning liquid for lithography. This content enables suppression of corrosion of the ILD material and the like while at the same time enabling efficient removal of the resist film, the bottom antireflective coating film, the sacrificial film, and furthermore residual materials originating from a metallic wiring layer and/or low dielectric constant layer produced as a result of an etching step.

Water-Soluble Organic Solvent

The cleaning liquid for lithography according to the present invention includes as a water-soluble organic solvent a highly polar solvent having a dipole moment of no less than 3.0 D, a glycol ether solvent and a polyhydric alcohol.

The highly polar solvent having a dipole moment of no less than 3.0 D is preferably at least one selected from sulfoxides such as dimethylsulfoxide (DMSO, dipole moment: 4.6 D); sulfones such as dimethyl sulfone (dipole moment: 5.1 D), diethyl sulfone (dipole moment: 4.7 D), and tetramethylene sulfone (dipole moment: 5.0 D); amides such as N,N-dimethylformamide (DMF, dipole moment: 4.5 D), N-methylformamide (dipole moment: 4.6 D), N,N-dimethylacetamide (DMAc, dipole moment: 4.6 D), N-methylacetamide (dipole moment: 4.3 D), and N,N-diethylacetamide (dipole moment: 4.7 D); lactams such as N-methyl-2-pyrrolidone (NMP, dipole moment: 4.6 D), N-ethyl-2-pyrrolidone (dipole moment: 4.7 D), N-hydroxymethyl-2-pyrrolidone (dipole moment: 3.1 D), and N-hydroxyethyl-2-pyrrolidone (dipole moment: 6.1 D); lactones such as β-propiolactone (dipole moment: 4.6 D), γ-butyrolactone (BGL, dipole moment: 5.1 D), γ-valerolactone (dipole moment: 5.3 D), δ-valerolactone (dipole moment: 5.4 D), γ-caprolactone (dipole moment: 5.2 D), and ∈-caprolactone (dipole moment: 5.5 D); and imidazolidinones such as 1,3-dimethyl-2-imidazolidinone (DMI, dipole moment: 4.5 D), 1,3-diethyl-2-imidazolidinone (dipole moment: 4.5 D), and 1,3-diisopropyl-2-imidazolidinone (dipole moment: 4.3 D).

Of these, highly polar solvents having a dipole moment of 3.5 to 7.0 D are preferred, and highly polar solvents having a dipole moment of 4.0 to 6.0 D are more preferred. Particularly, in light of stability in alkaline solutions, and the like, dimethylsulfoxide (dipole moment: 4.6 D) and N-methyl-2-pyrrolidone (dipole moment: 4.6 D) are preferred.

Examples of the glycol ether solvent include ethylene glycol monomethyl ether, ethylene glycol monoethyl ether, ethylene glycol monopropyl ether, ethylene glycol monobutyl ether, propylene glycol monomethyl ether (PGME), propylene glycol monoethyl ether, propylene glycol monopropyl ether, propylene glycol monobutyl ether, diethylene glycol monomethyl ether (MDG), diethylene glycol monoethyl ether (EDG), diethylene glycol monopropyl ether, diethylene glycol monobutyl ether (BDG), and the like.

Among these, in light of water solubility, removal performance of a resist film, flammability and the like, diethylene glycol monomethyl ether (MDG), diethylene glycol monoethyl ether (EDG), diethylene glycol monopropyl ether, and diethylene glycol monobutyl ether (BDG) are preferred.

Preferable polyhydric alcohols include ethylene glycol, propylene glycol, butylene glycol, glycerin, and the like. Of these, in light of safety, viscosity and the like, propylene glycol is preferred.

The content of the water soluble organic solvent is preferably 35 to 80% by mass, and more preferably 45 to 70% by mass relative to the total mass of the cleaning liquid for lithography.

Also, the content of the highly polar solvent is preferably 5 to 60% by mass, more preferably 10 to 50% by mass, and still more preferably 20 to 30% by mass relative to the total mass of the cleaning liquid for lithography. The removal performance of the bottom antireflective coating film can be improved by including the highly polar solvent at a content of no less than 5% by mass.

The content of the glycol ether solvent is preferably 5 to 55% by mass, more preferably 10 to 30% by mass, and still more preferably 10 to 20% by mass relative to the total mass of the cleaning liquid for lithography. The removal performance of the resist film can be improved by including the glycol ether solvent at a content of no less than 5% by mass.

The content of the polyhydric alcohol is preferably 5 to 30% by mass, more preferably 10 to 25% by mass, and still more preferably 15 to 25% by mass relative to the total mass of the cleaning liquid for lithography. The corrosion suppression performance for the ILD material can be improved by including the polyhydric alcohol at a content of no less than 5% by mass.

Particularly, in the cleaning liquid for lithography according to the present invention, the total content of the highly polar solvent and the glycol ether solvent is no less than 30% by mass, and more preferably no less than 40% by mass relative to the total mass of the cleaning liquid for lithography.

The water soluble organic solvent having the composition as described above enables the resist film and the bottom antireflective coating film to be efficiently removed while at the same time suppressing corrosion of the ILD material, and the like.

Water

The content of water is preferably 15 to 35% by mass, and more preferably 25 to 32% by mass relative to the total mass of the cleaning liquid for lithography. This content enables suppression of corrosion of the ILD material and the like while at the same time enabling efficient removal of the resist film, the bottom antireflective coating film, the sacrificial film, and furthermore residual materials originating from a metallic wiring layer and/or a low dielectric constant layer produced as a result of an etching step.

Inorganic Base

The inorganic base is preferably an alkali metal hydroxide such as potassium hydroxide, sodium hydroxide or rubidium hydroxide, and potassium hydroxide is more preferred. The content of the inorganic base is preferably 0.1 mass ppm to 1% by mass, and more preferably 1 mass ppm to 0.5% by mass relative to the total mass of the cleaning liquid for lithography. This content enables suppression of corrosion of the ILD material and the like while at the same time improving removal performance in relation to a sacrificial film.

Anti-Corrosion Agent

The cleaning liquid for lithography according to the present invention may further contain at least one anti-corrosion agent selected from a benzotriazol compound and a mercapto group-containing compound.

The benzotriazol compound includes compounds represented by the following general formula (2).

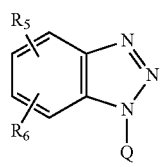

(2)

In the above general formula (2), $R_5$ and $R_6$ each independently represent a hydrogen atom, a hydrocarbon group having 1 to 10 carbon atoms which may include a substituent, a carboxyl group, an amino group, a hydroxyl group, a cyano group, a formyl group, a sulfonylalkyl group, or a sulfo group, and Q represents a hydrogen atom, a hydroxyl group, a hydrocarbon group having 1 to 14 carbon atoms which may include a substituent (wherein however, the hydrocarbon group may be interrupted by an amide bond or an ester bond), or a group represented by the following general formula (3).

(3)

In the above general formula (3), $R_7$ represents an alkylene group having 1 to 6 carbon atoms, and $R_8$ and $R_9$ each independently represent a hydrogen atom, a hydroxyl group, or a hydroxyalkyl group or an alkoxyalkyl group having 1 to 6 carbon atoms.

In each of the definitions of $R_5$, $R_6$ and Q in the above general formula (2), the hydrocarbon group may be either an aromatic hydrocarbon group or an aliphatic hydrocarbon group, may include an unsaturated bond, and may be a linear, branched or cyclic hydrocarbon group. The aromatic hydrocarbon group may be for example, a phenyl group, a p-tolyl group, or the like. The linear aliphatic hydrocarbon group may be for example, a methyl group, an n-propyl group, a vinyl group, or the like. The branched aliphatic hydrocarbon group may be for example, an i-butyl group, a t-butyl group, or the like. The cyclic aliphatic hydrocarbon group may be for example, a cyclopentyl group, a cyclohexyl group, or the like. The hydrocarbon group including a substituent may be for example, a hydroxyalkyl group, an alkoxyalkyl group, or the like.

Q in the above general formula (2) is preferably a group represented by the above general formula (3). In particular, of the groups represented by the above general formula (3), it is preferred that $R_8$ and $R_9$ be each independently selected from a hydroxyalkyl group or an alkoxyalkyl group having 1 to 6 carbon atoms.

Furthermore Q is preferably selected so that the compound represented by the above general formula (2) exhibits water-soluble properties. More specifically, a hydrogen atom, an alkyl group having 1 to 3 carbon atoms (i.e., a methyl group, an ethyl group, a propyl group or an isopropyl group), a hydroxyalkyl group having 1 to 3 carbon atoms, a hydroxyl group and the like are preferred.

For example, the benzotriazol compound more specifically includes benzotriazole, 5,6-dimethylbenzotriazole, 1-hydroxybenzotriazole, 1-methylbenzotriazole, 1-aminobenzotriazole, 1-phenylbenzotriazole, 1-hydroxymethylbenzotriazole, methyl 1-benzotriazole carboxylate, 5-benzotriazole carboxylic acid, 1-methoxy-benzotriazole, 1-(2,2-dihydroxyethyl)-benzotriazole, 1-(2,3-dihydroxypropyl)benzotriazole; and 2,2'-{[(4-methyl-1H-benzotriazole-1-yl)methyl]imino}bisethanol, 2,2'-{[(5-methyl-1H-benzotriazole-1-yl)methyl]imino}bisethanol, 2,2'-{[(4-methyl-1H-benzotriazole-1-yl)methyl]imino}bisethane, 2,2'-{[(4-methyl-1H-benzotriazole-1-yl)methyl]imino}bispropane and the like that are commercially available from Chiba Specialty Chemicals Co., Ltd. as "IREGAMET" series. Of the above compounds, 1-(2,3-dihydroxypropyl)-benzotriazole, 2,2'-{[(4-methyl-1H-benzotriazole-1-yl)methyl]imino}bisethanol, 2,2'-{[(5-methyl-1H-benzotriazole-1-yl)methyl]imino}bisethanol, and the like are preferably used. These benzotriazole compounds may be used alone, or in combination of two or more compounds.

The mercapto group-containing compound above is preferably a compound containing a hydroxyl group and/or a carboxyl group on at least one of the α-position and the β-position of a carbon atom that is bonded to the mercapto group. More specifically, such compounds include 1-thioglycerol, 3-(2-aminophenylthio)-2-hydroxypropylmercaptan, 3-(2-hydroxyethylthio)-2-hydroxypropylmercaptan, 2-mercaptopropionic acid, 3-mercaptopropionic acid, or the like. Of the above compounds, use of 1-thioglycerol is particularly preferred.

Surface Active Agent

The cleaning liquid for lithography according to the present invention may contain a surface active agent as required. The surface active agent which may be preferably used is an acetylene alcohol surface active agent, or the like. The content of the surface active agent is preferably less than 0.5% by mass relative to the total mass of the cleaning liquid for lithography.

Method for Forming Wiring

The method for forming a wiring according to the present invention is a method that uses a damascene method in which a metallic wiring layer is formed by embedding metal into an etching space that is formed in a dielectric layer of a semiconductor multilayer laminate using a resist film. After formation of the etching space, at least the resist film can be removed using the cleaning liquid for lithography according to the present invention.

The method for forming a wiring using a damascene method more specifically forms a metallic wiring by using a resist pattern formed on a low dielectric constant layer of the semiconductor multilayer laminate as a mask, applying an etching process to the low dielectric constant layer to form an etching space, and then embedding metal into the etching space. It should be noted that a bottom antireflective coating film (BARC) may be formed below on the bottom layer of the resist film. In addition, a sacrificial film may be temporarily embedded into the etching space.

The cleaning liquid for lithography according to the present invention is used when removing at least the resist film after the etching process is applied, and furthermore residual materials originating from a metallic wiring layer and/or a low dielectric constant layer produced by the etching step. In particular, since the cleaning liquid for lithography according to the present invention enables suppression of corrosion of the ILD material and the like while at the same time enabling efficient removal of the resist film and the bottom antireflective coating film, the cleaning liquid may be suitably used when removing at least the resist film and the bottom antireflective coating film after forming an etching space in the low dielectric constant layer using the resist film and the bottom antireflective coating film.

There is no particular limitation on the method of removing the resist film, the bottom antireflective coating film and the like as long as it is a normally used removal method. More specifically, for example, use of an immersion method, a paddle method, a shower method, or the like enables processing by placing the cleaning liquid for lithography according to the present invention in direct contact for 1-40 minutes with the substrate. Although the removal process may be normally performed at ambient temperature, it may be also performed by heating the cleaning liquid for lithography to approximately 85° C. in order to increase the removal effect.

As the material for forming the resist film, a resist material conventionally used for an excimer laser (KrF, ArF, $F_2$, or EUV), or electron rays may be employed according to a standard method.

Also, as the material for forming the bottom antireflective coating film, an inorganic or organic material for bottom antireflective coating films which has been conventionally used may be employed according to a standard method.

Use of this type of conventional resist material and material for bottom antireflective coating films enables formation of a resist film and a bottom antireflective coating film on an interlayer insulation layer, or on a barrier layer thereon. After using the mask to expose the resist film, a development process is applied to thereby form a resist pattern. Next, residue materials of the resist pattern after execution of etching using the resist pattern as a mask are removed by the cleaning liquid for lithography according to the present invention together with other residual materials, generated during the etching step, originating from the bottom antireflective coating film and the sacrificial film, and from a metallic wiring layer or a low dielectric constant layer.

More specifically, the low dielectric constant layer is a layer formed from a material such as a carbon-doped oxide (SiOC), methyl silsesquioxane (MSQ), or hydrogen silsesquioxane (HSQ). The low dielectric constant layer preferably has a dielectric constant (k) of no greater than 3.0 in order to prevent effects on the electrical characteristics of the metallic wiring layer.

The low dielectric constant layer may be formed on the metallic wiring layer, or may be formed after forming a barrier layer on the metallic wiring layer. The firing temperature for the low dielectric constant layer is normally a high temperature of 350° C. or more.

More specifically, the material for forming the low dielectric constant layer as described above, that is to say, a low dielectric material (ILD material) includes carbon-doped oxide black diamond (Trade Name, manufactured by Applied Materials), Coral (Trade Name, manufactured by Novelus Systems), Aurora (Trade Name, manufactured by Japan ASM) and methyl silsesquioxane-based OCL T-31 and OCL T-37, OCL T-39 (All Trade Names, manufactured by Tokyo Ohka Kogyo), hydrogen silsesquioxane-based OCD T-12 and OCD T-32 (All Trade Names, manufactured by Tokyo Ohka Kogyo), and the like.

The barrier layer may be for example, SiC, SiN, SiCN, Ta, TaN, or the like. This type of barrier layer may be formed between a low dielectric constant layer and a low dielectric constant layer.

The metallic material for forming the metallic wiring layer used in relation to the damascene method may be mainly Cu, but a conductive material such as Al, Ti or W may be also laminated in addition to Cu on the same substrate. The cleaning liquid for lithography according to the present invention enables effective suppression of corrosion even when the cleaning liquid comes into direct contact with these metallic materials.

The cleaning liquid for lithography according to the present invention finds application even when employing a damascene method, and in particular, in a method for forming a wiring using a damascene method in which a temporary sacrificial layer is provided in a formed etching space. More specifically, the material (embedded material) for forming the sacrificial layer is suitably a spin-on glass material obtained by a condensation reaction.

The spin-on glass material for forming the sacrificial film is suitably a compound obtained via hydrolysis by the action of an acid present in water of at least one compound selected from the compounds represented by the following general formulae (4) to (6).

(4)

-continued

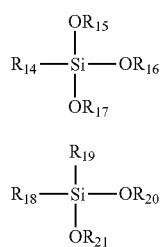

In the above general formulae (4) to (6), $R_{10}$ to $R_{13}$, $R_{15}$ to $R_{17}$, $R_{20}$ and $R_{21}$ each independently represent an alkyl group having 1 to 4 carbon atoms or a phenyl group, and $R_{14}$, $R_{18}$ and $R_{19}$ represent a hydrogen atom or an alkyl group having 1 to 4 carbon atoms.

Of the compounds represented by the above general formula (4), tetramethoxysilane or tetraethoxysilane, or oligomers thereof are preferred. Of the compounds represented by the above general formula (5), trimethoxysilane or triethoxysilane, or oligomers thereof are preferred. Of the compounds represented by the above general formula (6), dimethoxysilane, diethoxysilane or methyldimethoxysilane, or oligomers thereof are preferred. These spin-on glass materials may be used by suitably selecting one or two or more types thereof.

A highly absorbent material may be suitably formulated into the compound represented by the above general formulae (4) to (6). The highly absorbent material is not particular limited but may be a material having a substituent in its structure capable of condensing with the spin-on glass material above, may have a strong absorbent function in relation to light in a specific light-sensitive wavelength band of a light-sensitive component of the resist material, and may be a material that prevents diffuse reflection due to an irregularity on the substrate surface or a standing wave produced by reflected light from the substrate. Such compounds include sulfone compounds, benzophenone compounds, anthracene compounds, naphthalene compounds or the like that are substituted with hydroxyl groups and/or carboxyl groups. In particular, preferred compounds include bisphenyl sulfone compounds and benzophenone compounds including at least two hydroxyl groups, anthracene compounds including at least one hydroxyl and/or hydroxyalkyl group, anthracene compounds including a carboxyl group and/or a hydroxyl group, and naphthalene compounds substituted with at least one carboxyl group and/or hydroxyl group.

The content of the highly absorbent material may be preferably 10 to 50% by weight, and more preferably 15 to 40% by weight at a $SiO_2$ equivalent solid concentration in the spin-on glass material.

EXAMPLES

Although the embodiments of the present invention will be described hereafter to explain the present invention in further detail, the present invention is not limited by the embodiments below.

Preparation of Cleaning Liquid for Lithography

Cleaning liquids for lithography were prepared based on the formulation amount and the composition shown in Tables 1 and 2 below. Each test reagent was a generally commercially available reagent unless there is a particular indication to the contrary. The figures in the Tables express units of % by mass unless there is a particular indication to the contrary.

TABLE 1

|  | quaternary ammonium hydroxide | inorganic base | highly polar solvent (dipole moment: no less than 3.0 D) | glycol ether solvent | polyhydric alcohol | water |
| --- | --- | --- | --- | --- | --- | --- |
| Example 1 | TMAH (10) | KOH (200 ppm) | DMSO (5) | EDG (35) | PG (20) | (remaining component) |
| Example 2 | TMAH (7.5) | KOH (200 ppm) | DMSO (10) | EDG (55) | PG (5) | (remaining component) |
| Example 3 | TMAH (10) | KOH (200 ppm) | DMSO (40) | MDG (10) | glycerin (10) | (remaining component) |
| Example 4 | TMAH (7.5) | KOH (200 ppm) | DMF (40) | EDG (20) | PG (10) | (remaining component) |
| Example 5 | TEAH (10) | KOH (200 ppm) | DMSO (20) | BDG (20) | PG (20) | (remaining component) |
| Example 6 | TMAH (7.5) | KOH (200 ppm) | NMP (40) | EDG (20) | PG (10) | (remaining component) |
| Example 7 | TMAH (5) | KOH (200 ppm) | DMSO (60) | BDG (10) | PG (10) | (remaining component) |
| Example 8 | TMAH (7.5) | KOH (200 ppm) | NMP (30) | EDG (30) | EG (10) | (remaining component) |
| Example 9 | TMAH (10) | KOH (200 ppm) | DMF (22.5) | BDG (22.5) | PG (15) | (remaining component) |
| Example 10 | TMAH (10) | NaOH (200 ppm) | DMSO (17.5) | BDG (17.5) | PG (25) | (remaining component) |
| Example 11 | TMAH (10) | KOH (200 ppm) | GBL (17.5) | BDG (17.5) | PG (25) | (remaining component) |
| Example 12 | TMAH (10) | KOH (200 ppm) | DMSO (10) | EDG (20) | PG (30) | (remaining component) |
| Example 13 | TMAH (10) | KOH (200 ppm) | DMSO (50) | EDG (5) | PG (5) | (remaining component) |

TABLE 2

| | quaternary ammonium hydroxide | inorganic base | highly polar solvent (dipole moment: no less than 3.0 D) | glycol ether solvent | polyhydric alcohol | water |
|---|---|---|---|---|---|---|
| Comparative Example 1 | TMAH (10) | KOH (200 ppm) | DMSO (60) | — | — | (remaining component) |
| Comparative Example 2 | TMAH (10) | KOH (200 ppm) | — | EDG (60) | — | (remaining component) |
| Comparative Example 3 | TMAH (10) | KOH (200 ppm) | — | — | PG (60) | (remaining component) |
| Comparative Example 4 | TMAH (10) | KOH (200 ppm) | NMP (30) | EDG (30) | — | (remaining component) |
| Comparative Example 5 | TMAH (10) | KOH (200 ppm) | DMSO (30) | — | PG (30) | (remaining component) |
| Comparative Example 6 | TMAH (10) | KOH (200 ppm) | — | BDG (30) | PG (30) | (remaining component) |
| Comparative Example 7 | TMAH (10) | KOH (200 ppm) | DMSO (10) | BDG (10) | PG (40) | (remaining component) |

The abbreviations in the above Tables 1 and 2 are as in the following.

| | |
|---|---|
| TMAH: | tetramethyl ammonium hydroxide |
| TEAH: | tetraethyl ammonium hydroxide |
| DMSO: | dimethylsulfoxide |
| NMP: | N-methyl-2-pyrrolidone |
| DMF: | N,N-dimethylformamide |
| GBL: | γ-butyrolactone |
| EDG: | diethylene glycol monoethyl ether |
| MDG: | diethylene glycol monomethyl ether |
| BDG: | diethylene glycol monobutyl ether |
| PG: | propylene glycol |
| EG: | ethylene glycol |

Removing Characteristics of Resist Film

An ArF resist material "TArF-P6111" (manufactured by Tokyo Ohka Kogyo Co., Ltd.) was applied on a silicon wafer having a diameter of 20 cm, and heated at 90° C. for 90 sec and at 180° C. for 90 sec, thereby forming a resist film with a film thickness of 350 nm. The wafer on which the resist film had been formed was subjected to immersion processing at 25° C. for 5 min in the cleaning liquid for lithography shown in Tables 1 and 2, and then rinsed in pure water. The state of removal of the resist film following such a procedure was evaluated by measuring the film thickness. The results are shown in Table 3.

Removing Characteristics of Bottom Antireflective Coating Film

An organic material for bottom antireflective coating films "ARC-160" (manufactured by Nissan Chemical Industries, Ltd.) was applied on a silicon wafer having a diameter of 20 cm, and heated at 90° C. for 90 sec and at 205° C. for 60 sec, thereby forming a bottom antireflective coating film with a film thickness of 90 nm. The wafer on which the bottom antireflective coating film had been formed was subjected to immersion processing at 25° C. for 5 min in the cleaning liquid for lithography shown in Tables 1 and 2, and then rinsed in pure water. The state of removal of the bottom antireflective coating film following such a procedure was evaluated by measuring the film thickness. The results are shown in Table 3.

Removing Characteristics of Embedded Material

A substrate on which a film of an embedding material consisting of a spin-on glass material (manufactured by Honeywell International Inc.) had been formed was subjected to immersion processing at 50° C. for 1 min in the cleaning liquid for lithography shown in Tables 1 and 2, and then rinsed in pure water. The state of removal of the embedded material following such a procedure was evaluated by measuring the film thickness. The results are shown in Table 3.

Suppression of Low-k Material Corrosion

A trench resist pattern was formed using a lithography method on a substrate on which a low dielectric constant layer (dielectric material being CVD vapor deposited with a relative permittivity of 2.7 to 2.8) had been formed. Using this trench resist pattern as a mask, the low dielectric constant layer was subjected to dry etching to form a trench pattern. This substrate was subjected to immersion processing at 50° C. for 10 min in the cleaning liquid for lithography shown in Tables 1 and 2, and then rinsed in pure water. The corrosion state of the Low-k material following such a procedure was evaluated by observation with a SEM (scanning electron microscope). The results are shown in Table 3.

TABLE 3

| | Removing characteristics of resist | Removing characteristics of bottom antireflective coating film | Removing characteristics of embedded material | Suppression of Low-k material corrosion |
|---|---|---|---|---|
| Example 1 | A | B | A | A |
| Example 2 | A | B | A | B |
| Example 3 | A | A | A | A |
| Example 4 | A | A | A | A |
| Example 5 | A | A | A | A |
| Example 6 | A | A | A | A |
| Example 7 | B | A | A | A |
| Example 8 | A | A | A | A |
| Example 9 | A | A | A | A |
| Example 10 | A | A | A | A |
| Example 11 | A | A | A | A |
| Example 12 | B | B | A | A |
| Example 13 | B | A | A | B |
| Comparative Example 1 | B | A | A | C |
| Comparative Example 2 | A | C | A | C |
| Comparative Example 3 | C | C | C | A |
| Comparative Example 4 | A | A | A | C |
| Comparative Example 5 | C | A | A | A |
| Comparative Example 6 | B | C | A | A |
| Comparative Example 7 | C | C | B | A |

With respect to evaluation results shown in Table 3, "A" and "B" denote a favorable removing characteristic or suppression of corrosion. Of these, "A" denotes a particularly favorable removing characteristic or suppression of corrosion. On the other hand, "C" denotes an insufficient removing characteristic or suppression of corrosion.

As is seen from Table 3, use of the cleaning liquid for lithography including as a water soluble organic solvent all three components of: a highly polar solvent having a dipole moment of no less than 3.0 D; a glycol ether solvent; and a polyhydric alcohol, and having a total content of the highly polar solvent and the glycol ether solvent relative to the total mass of the cleaning liquid for lithography being no less than 30% enabled the resist film and the bottom antireflective coating film to be efficiently removed while at the same time suppressing corrosion of the ILD material (see Examples 1 to 13).

To the contrary, when at least one of the highly polar solvent, the glycol ether solvent and the polyhydric alcohol is not included, the corrosion suppression performance of the ILD material, or the removal effect of the resist film or the bottom antireflective coating film was inferior (see Comparative Examples 1 to 6). In addition, even when all the highly polar solvent, the glycol ether solvent, and the polyhydric alcohol were included as the water soluble organic solvent, the removal effect of the resist film and the bottom antireflective coating film was inferior when the total content of the highly polar solvent and the glycol ether solvent was too low (see Comparative Example 7).

What is claimed is:

1. A cleaning liquid for lithography comprising a quaternary ammonium hydroxide in an amount from 5% to 10% by mass, a water-soluble organic solvent in an amount from 35% to 80% by mass, water and an inorganic base, wherein:
   the quaternary ammonium hydroxide is at least one selected from the group consisting of tetramethyl ammonium hydroxide and tetraethyl ammonium hydroxide;
   the water soluble organic solvent comprises a highly polar solvent in an amount from 5% to 60% by mass having a dipole moment of no less than 3.0 D, a glycol ether solvent in an amount from 5% to 55% by mass and a polyhydric alcohol in an amount from 5% to 30% by mass; and
   the total content of the highly polar solvent and the glycol ether solvent is no less than 30% by mass relative to the total mass of the cleaning liquid for lithography;
   the highly polar solvent is at least one selected from the group consisting of dimethylsulfoxide, N,N-dimethylformamide, N-methylpyrrolidone and γ-buyrolactone;
   the glycol ether solvent is at least one selected from the group consisting of diethylene glycol monomethyl ether, diethylene glycol monoethyl ether and diethylene glycol monobutyl ether; and
   the polyhydric alcohol is at least one selected from the group consisting of ethylene glycol, propylene glycol and glycerin.

2. A method for forming a wiring which forms a metallic wiring layer by embedding a metal into an etching space that is formed in a dielectric layer of a semiconductor multilayer laminate using a resist film, the method comprising after formation of the etching space, removing at least the resist film using the cleaning liquid for lithography according to claim 1.

3. The method for forming a wiring according to claim 2, wherein an antireflective coating film is provided on the bottom layer of the resist film, and
   the method comprising after formation of the etching space, removing at least the resist film and the antireflective coating film using the cleaning liquid for lithography.

* * * * *

UNITED STATES PATENT AND TRADEMARK OFFICE
CERTIFICATE OF CORRECTION

PATENT NO. : 8,354,365 B2
APPLICATION NO. : 13/016868
DATED : January 15, 2013
INVENTOR(S) : Takuya Ohhashi et al.

Page 1 of 1

It is certified that error appears in the above-identified patent and that said Letters Patent is hereby corrected as shown below:

In the Specifications

At Column 6, Line 54, Change ""IREGAMET"" to --"IRGAMET"--.

At Column 8, Line 27 (Approx.), Change "Novelus" to --Novellus--.

In the Claims

At Column 14, Line 13 (Approx.), In Claim 1, change "buyrolactone;" to --butyrolactone;--.

Signed and Sealed this
Sixth Day of August, 2013

Teresa Stanek Rea
*Acting Director of the United States Patent and Trademark Office*